(12) United States Patent
Tunks et al.

(10) Patent No.: US 11,968,807 B2
(45) Date of Patent: Apr. 23, 2024

(54) HEATER APPARATUS AND AIR CIRCULATION COMPONENT-INTEGRATED BEZEL FOR A COMPUTING DEVICE

(71) Applicant: Dell Products L.P., Round Rock, TX (US)

(72) Inventors: Eric Michael Tunks, Austin, TX (US); Ayedin Nikazm, Austin, TX (US); Richard Mark Eiland, Austin, TX (US); Tyler Baxter Duncan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 280 days.

(21) Appl. No.: 17/576,680

(22) Filed: Jan. 14, 2022

(65) Prior Publication Data
US 2023/0232594 A1 Jul. 20, 2023

(51) Int. Cl.
| | |
|---|---|
| *H05K 7/00* | (2006.01) |
| *F24H 3/02* | (2022.01) |
| *F24H 15/204* | (2022.01) |
| *H05K 7/20* | (2006.01) |

(52) U.S. Cl.
CPC ......... *H05K 7/20836* (2013.01); *F24H 3/022* (2013.01); *F24H 15/204* (2022.01)

(58) Field of Classification Search
None
See application file for complete search history.

(56) References Cited

U.S. PATENT DOCUMENTS

| | | | | |
|---|---|---|---|---|
| 7,995,349 B2 * | 8/2011 | Merrow | ............... | G11B 33/128 361/728 |
| 9,002,186 B2 * | 4/2015 | Akers | ............... | H05K 7/20145 392/432 |
| 11,812,586 B2 * | 11/2023 | Li | ...................... | H05K 7/20745 |

\* cited by examiner

*Primary Examiner* — Imani N Hayman
*Assistant Examiner* — Rashen E Morrison
(74) *Attorney, Agent, or Firm* — Chamberlain, Hrdlicka, White, Williams & Aughtry; Aly Z. Dossa

(57) ABSTRACT

A computing device includes a bezel and an enclosure. The bezel includes an air circulation component and a heater apparatus. The enclosure includes a plurality of hardware components, and the bezel is affixed to a frontside of the enclosure and configured to heat an internal volume of the enclosure.

20 Claims, 5 Drawing Sheets

HEATER APPARATUS AND AIR CIRCULATION COMPONENT-INTEGRATED BEZEL FOR A COMPUTING DEVICE

BACKGROUND

Computing devices may perform services. In order to provide the services, the computing devices may include hardware components and software components. The software components may utilize the hardware components to provide the services.

SUMMARY

In general, in one aspect, the invention relates to a computing device. The computing device includes a bezel and an enclosure. The bezel includes an air circulation component and a heater apparatus. The enclosure includes a plurality of hardware components, and the bezel is affixed to a frontside of the enclosure and configured to heat an internal volume of the enclosure.

In general, in one aspect, the invention relates to a method for managing a temperature of an internal volume of an enclosure. The method for managing the temperature of the internal volume of the enclosure may include making a determination, based on a current temperature of the internal volume of the enclosure, that the current temperature of the internal volume of the enclosure is below a threshold. In response to the determination, turning on an air circulation component and a heater located in a bezel of the enclosure.

In general, in one aspect, the invention relates to an information handling system including a cabinet housing a plurality of computing devices. Each computing device includes a bezel and an enclosure. The bezel includes an air circulation component and a heater apparatus. The enclosure includes a plurality of hardware components, and the bezel is affixed to a frontside of the enclosure and configured to heat an internal volume of the enclosure.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

DETAILED DESCRIPTION

Figure 1:
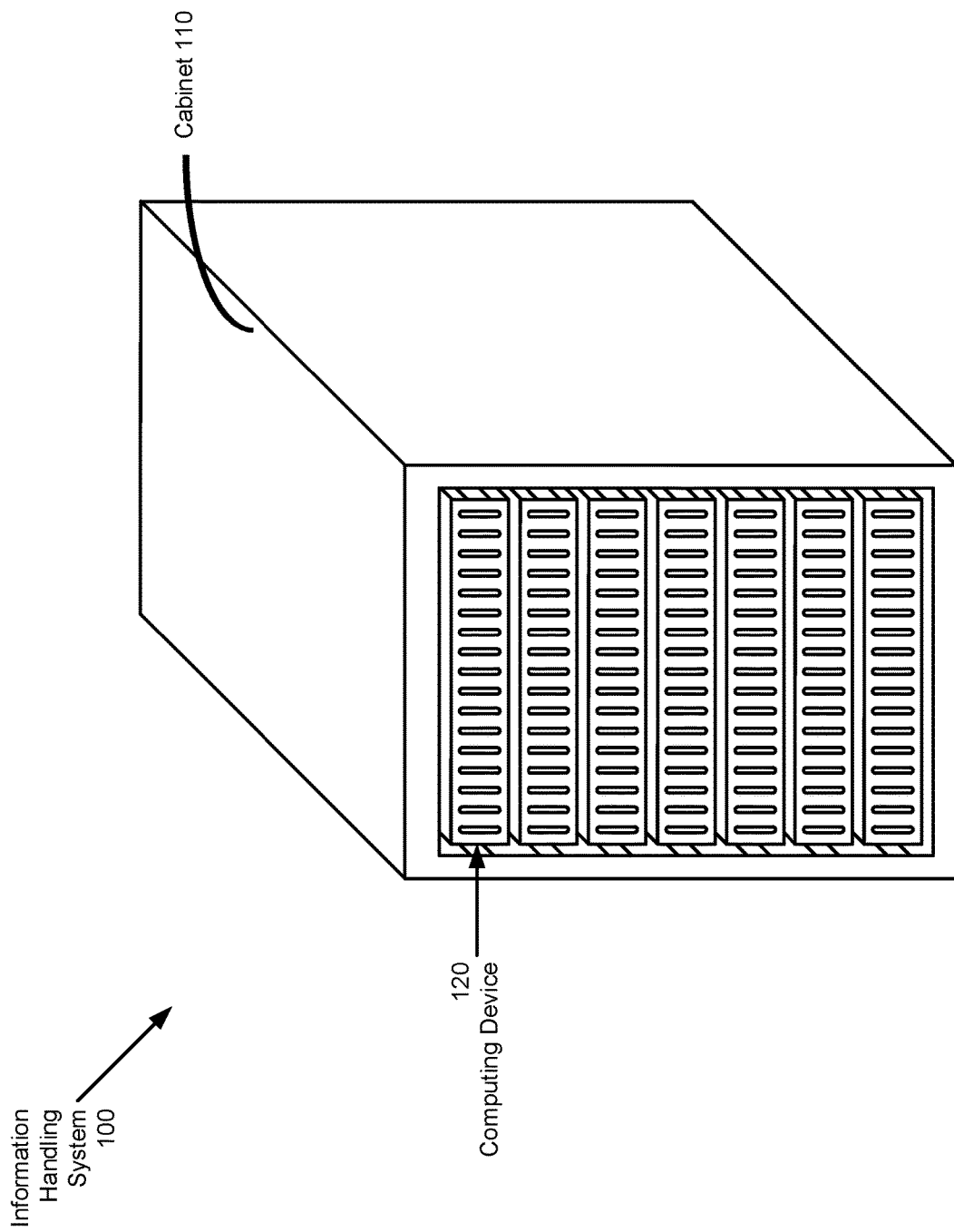
FIG. 1 shows a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Computing devices may include any number of hardware components that facilitate providing the services of the computing devices. The hardware components may include, for example, processors, non-persistent storage drives, persistent storage drives, circuit cards that interconnect these components, etc. In some cases, computing devices might be deployed in environments that result in the temperature of the computing devices being outside of their designed operating range. For example, the computing devices may be designed to operate at temperatures above 0° C. When the computing devices are deployed to harsh environmental conditions (e.g., −40° C.-60° C.), the computing devices may not operate properly and, in certain scenarios, may be damaged.

To address one or more of the aforementioned issues, embodiments of the invention provide a mechanism to manage a temperature of an internal volume of a computing device. More specifically, embodiments of the invention include a bezel and an enclosure, where the bezel includes an air circulation component and a heater apparatus. The bezel is configured to bring the hardware components to a temperature that is within their designed operating range.

Various embodiments of the computing device are described below.

FIG. 1 shows a diagram of an information handling system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a rack mountable enclosure that enables the computing devices (e.g., 120) to be disposed within it. The cabinet (110) may be implemented as other types of structures adapted to house, position, orient, and/or otherwise physically, mechanically, electrically, and/or thermally manage the computing devices (e.g., 120). By managing the computing devices (e.g., 120), the cabinet (110) may enable multiple computing devices to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Figure 2:
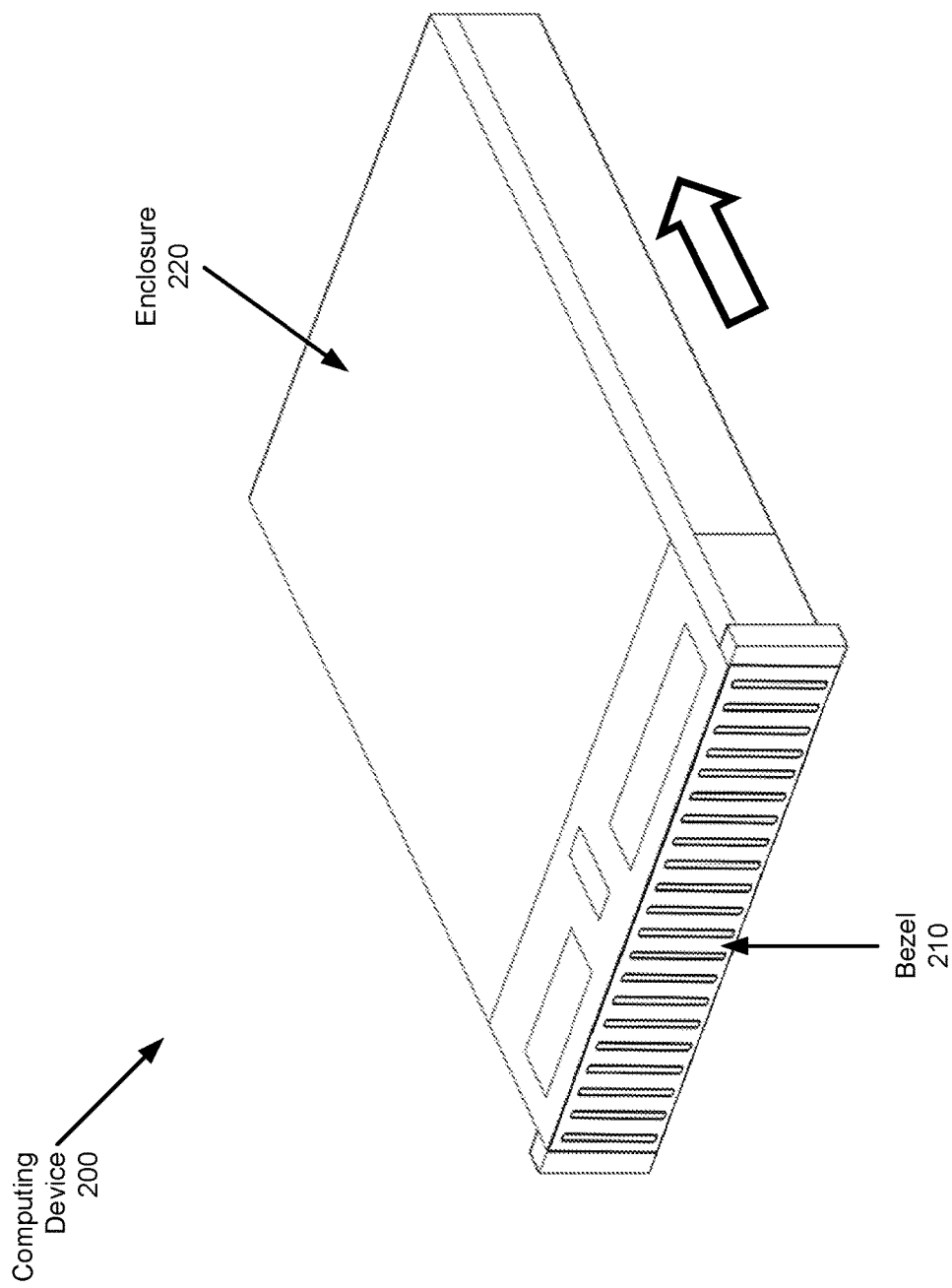
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes a heater apparatus- and an air circulation component-integrated bezel (210) and an enclosure (220). The enclosure includes six sides (i.e., top, bottom, right, left, front, and back), where air drawn into from the frontside of the enclosure and expelled from the backside of the enclosure (airflow direction is shown with an arrow). The bezel (210) is affixed to the frontside of the enclosure (220) and in general, air incoming from the frontside of the enclosure is cooler than air outgoing from the backside of the enclosure.

Figure 3:
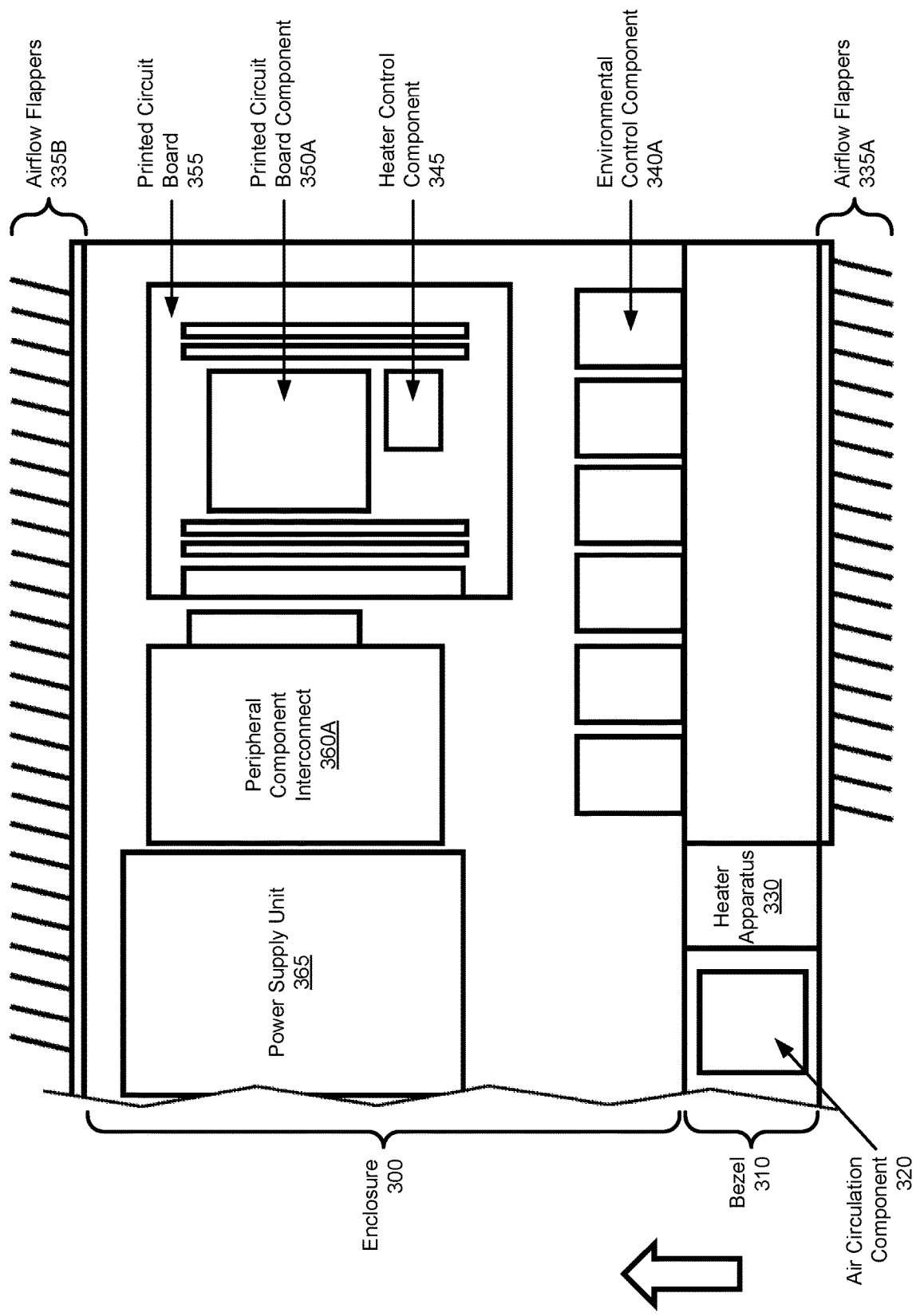
FIG. 3 shows a top-view of a portion of a computing device in accordance with one or more embodiments of the invention.

In one or more embodiments of the invention, to provide services, the computing device (200) may utilize computing device resources provided by a number of hardware components housed within the computing device. The number of hardware components may include, for example, persistent storage drives (not shown), non-persistent storage drives (not shown), processors (not shown), peripheral component interconnects (not shown), a printed circuit board (not shown), and/or other types of physical components that contribute to the operation of the computing device (200). Some examples of the hardware components are shown in FIG. 3, but the examples of the hardware components are not limited to those shown in FIG. 3. In other embodiments, one or more of the hardware components may be omitted or additional hardware components may be added based on the services provided by the computing device.

Turning now to FIG. 3, FIG. 3 shows a top-view of a portion of a computing device in accordance with one or more embodiments of the invention. In one or more embodiments of the invention, the top-view of the portion of the computing device includes an enclosure (300), a bezel (310), an air circulation component (320), a heater apparatus (330), a number of airflow flappers (e.g., 335A, 335B), an environmental control component (e.g., 340A), a heater control component (345), a printed circuit board component (e.g., 350A), a printed circuit board (355), a peripheral component interconnect (e.g., 360A), and a power supply unit (365), and a temperature sensor (not shown). In an embodiment of the invention shown in FIG. 3, the airflow direction is shown with an arrow.

Those skilled in the art will appreciate that the heater control component (345) and the temperature sensor may be placed at any location within the computing device (e.g., 200, FIG. 2) without departing from the invention. For example, (i) both the heater control component (345) and the temperature sensor may be located within the bezel (310), (ii) both the heater control component (345) and the temperature sensor may be located within the enclosure (300), (iii) the heater control component (345) may be located inside the enclosure (300) and the temperature sensor may be located inside the bezel (310), and (iv) the heater control component (345) may be located inside the bezel (310) and the temperature sensor may be located inside the enclosure (300).

In one or more embodiments of the invention, the heater control component (345) may provide heating control services. The heating control services may include (i) obtaining information regarding the temperature of one or more hardware components within the enclosure (300), where the information may be obtained through the temperature sensor in the enclosure, (ii) determining whether the temperature within the enclosure is below the appropriate operating temperature range (e.g., whether the temperature is below 0° C.), (iii) initiating a heating process to bring the hardware components of the enclosure into their designed operating temperature, and (iv) preventing damage (e.g., thermal runaway) to the heater in the event of overheating.

While described as a physical structure, the heater control component (345) may be implemented as a logical entity (e.g., a program executing on a hardware component in the enclosure that provides the functionality of the heater control component (345).

In one or more embodiments of the invention, the heater control component (345) is configured to initiate operation of the air circulation component (320) and the heater apparatus (330) when a temperature of the internal volume of the enclosure (300) is below a threshold (which may be, e.g., a manufacturer set default value, a user set value, etc.).

In one or more embodiments of the invention, when the heater control component (345) determines to initiate the operation of the air circulation component (320) and the heater apparatus (330), it may instruct a power distribution unit (not shown) to provide power to the air circulation component (320) and the heater apparatus (330).

Continuing the discussion of FIG. 3, in one or more embodiments of the invention, one end of the temperature sensor operatively connected to the heater control component (345), while the other end of the temperature sensor operatively connected to at least one hardware component within the computing device (e.g., 200, FIG. 2) and configured to detect a temperature within the computing device.

In one or more embodiments of the invention, the heater apparatus (330) includes a heater (not shown) and a heat sink (not shown). The heater has a number of surfaces that is heated and when air passes through them, the induced heat is transferred from the heater to a volume of air that is drawn into the internal volume of the enclosure (300). Further, the heat sink, when heated by the heater, provides a uniform (or substantially uniform) distribution of heated volume of air drawn into the internal volume of the enclosure (300) through its fins, where a base of the heat sink is affixed to the heater. With this way, the surface area of the heater will be enlarged indirectly to increase the efficiency of the heater.

Those skilled in the art will appreciate that while the embodiment of the invention shown in FIG. 3 includes the heat sink (not shown), there may be embodiments of the invention that do not include the heat sink without departing from the invention.

In one or more embodiments of the invention, air within the internal volume of the enclosure (300) is circulated by the air circulation component. In one embodiment of the invention, an airflow direction of the air circulation component (320) is orthogonal to the airflow direction of the environmental control component (e.g., 340A). More specifically, air inlet and air outlet directions of the air circulation component (320) are orthogonal to air inlet and air outlet directions of the environmental control component (e.g., 340A). For example, based on the top-view of the portion of the computing device shown in FIG. 3, the airflow direction of the air circulation component (320) is from leftside to rightside, while the airflow direction of the environmental control component is from bottomside to topside (along the arrow direction). By this way, a uniform air circulation in the internal volume of the enclosure (300) may be formed. The air circulation component may have a different orientation without departing from the invention.

In one or more embodiments of the invention, the number of airflow flappers (e.g., 335A, 335B) restricts or allows the volume of air that is drawn into and/or expelled from the computing device (e.g., 200, FIG. 2). The number of airflow flappers (e.g., 335A, 335B) operates depending on a pressure difference within the enclosure (300). For example, when low pressure is induced at the backside of the enclosure (e.g., enclosure exhaust) and high pressure is induced at the frontside of the enclosure (e.g., enclosure inlet), the number of airflow flappers (e.g., 335A, 335B) will be closed. Further, the number of airflow flappers may be made of flexible metal, plastic, any other rigid material, and/or any combination thereof that enables the number of airflow flappers to perform the functions described herein.

Those skilled in the art will appreciate that while the printed circuit board (355), the printed circuit board component (e.g., 350A), the peripheral component interconnect (e.g., 360A), the power supply unit (365), and the heater control component (345) are shown that they are located at the backside of the computing device, those components may be placed at any location within the enclosure (300) device without departing from the invention. Similarly, while the bezel (310) and the environmental control component (e.g., 340A) are shown that they are located at the frontside of the enclosure, those components may be placed at any location within the enclosure without departing from the invention.

In one or more embodiments of the invention, the environmental control component (e.g., 340A) may include a physical device that provides functionality to alter characteristics (e.g., airflow directions, humidity and temperature levels, etc.) of the internal volume of the enclosure (300) at a macroscopic level. For example, the environmental control component (e.g., 340A) may include gas movers such as fans. The fans may be able to change a rate of gases drawn into and expelled from the enclosure.

Figure 4:
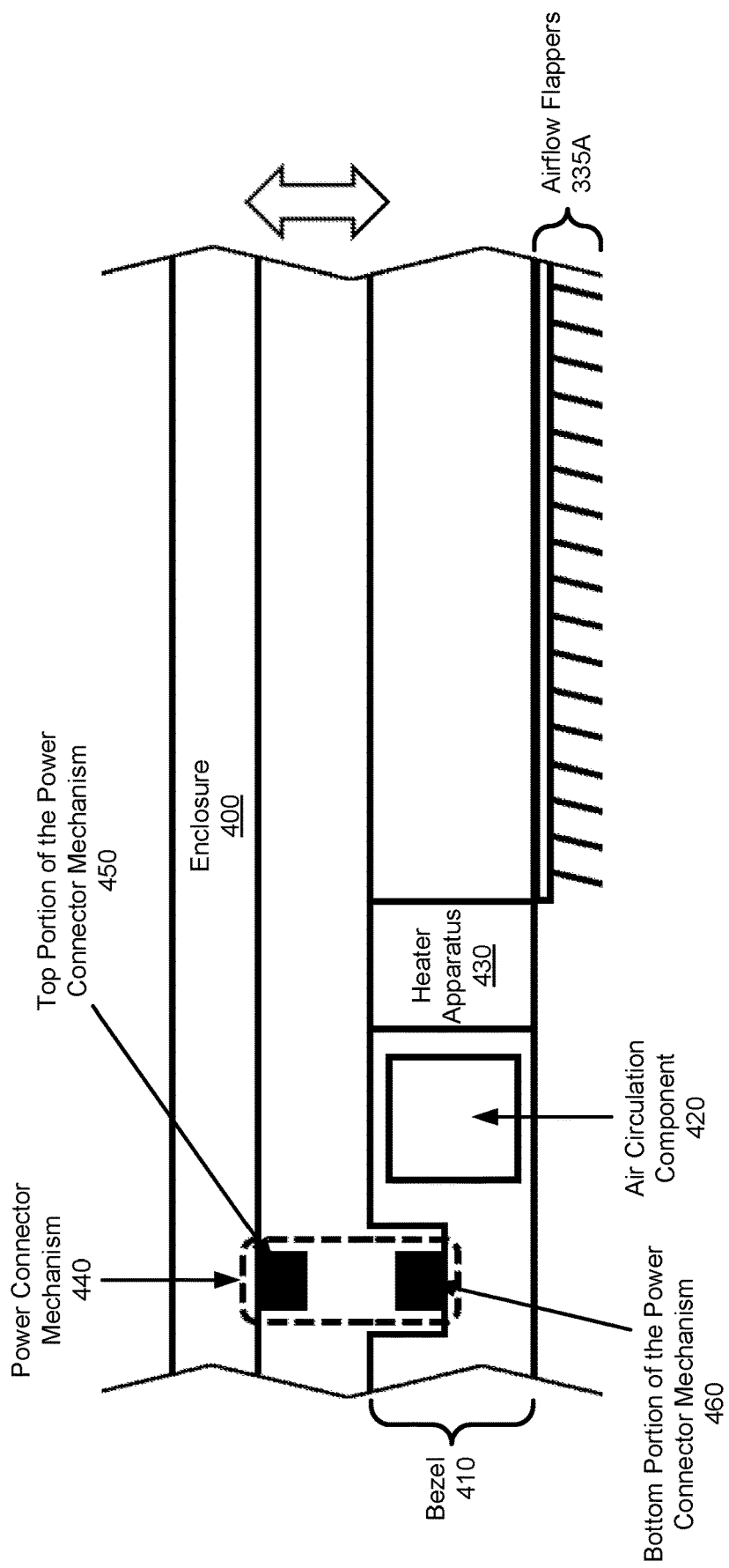
FIG. 4 shows a top-view of a portion of a computing device in accordance with one or more embodiments of the invention.

Turning now to FIG. 4, FIG. 4 shows a top-view of a portion of a computing device in accordance with one or more embodiments of the invention. In one or more embodiments of the invention, the top-view of the portion of the computing device includes a number of airflow flappers (e.g., 335A), an enclosure (400), a bezel (410), an air circulation component (420), a heater apparatus (430), a power connector mechanism (440, shown with a dashed line), in which the power connector mechanism includes a top portion (450) and a bottom portion (460). In one or more embodiments of the invention, the power connector mechanism (440) may include a blind-mate power connector or a magnetic power connector. The top portion of the power connector mechanism (450) is operatively connected to the enclosure (400), where the enclosure provides the required power to the bezel (410) to initiate the heating process, and the bottom portion of the power connector mechanism (460) operatively connected to the bezel.

In an embodiment of the invention shown in FIG. 4, the double-sided arrow indicates a feature of the bezel (410), where the bezel can be dynamically installed to the enclosure (400) even after the deployment of the computing device (e.g., 200, FIG. 2) to the harsh environmental conditions.

While FIG. 4 shows a power connector mechanism, any configuration of the power connector mechanism at any location within the enclosure (400) may be used to provide the required power to the heater located in the bezel (410) to initiate the heating process without departing from the invention. Those skilled in the art will appreciate that the heater may be supplied with power, directly or indirectly (e.g., via the heating control component, the printed circuit board, etc.), via one or more power supplies (not shown) within the enclosure (400).

Figure 5:
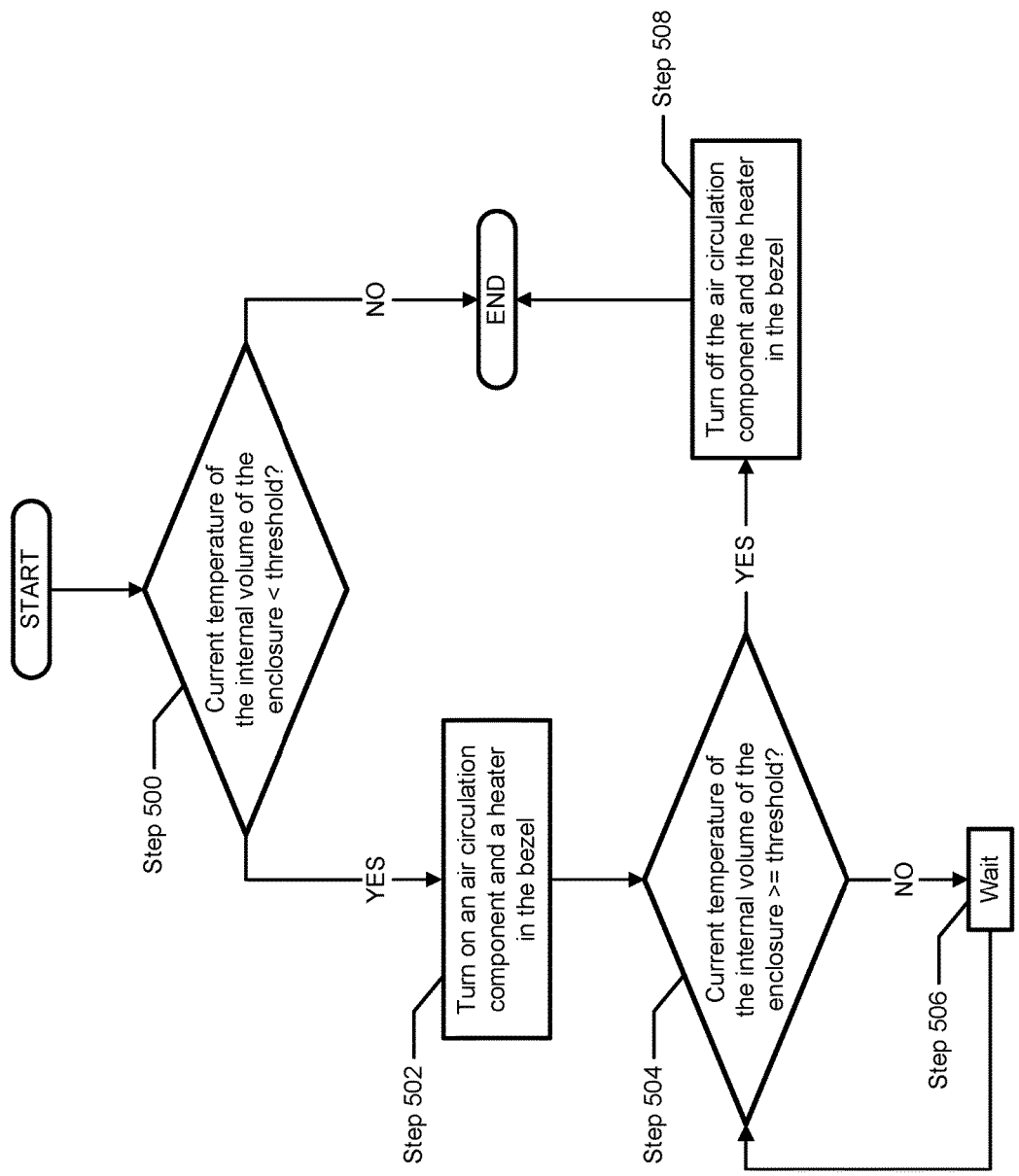
FIG. 5 shows a flowchart of a method for managing a temperature of an internal volume of a computing device in accordance with one or more embodiments of the invention.

Turning now to FIG. 5, FIG. 5 shows a flowchart of a method for managing a temperature of an internal volume of a computing device in accordance with one or more embodiments of the invention. The method shown in FIG. 5 may be performed by, for example, a heater control component (e.g., 345, FIG. 3). Other hardware components of the computing device illustrated in FIG. 3 may perform all, or a portion, of the method shown in FIG. 5 without departing from the invention.

While FIG. 5 is illustrated as a series of steps, any of the steps may be omitted, performed in a different order, additional steps may be included, and/or any or all of the steps may be performed in a parallel and/or partially overlapping manner without departing from the invention.

In Step 500, a determination is made about whether the current temperature of the internal volume of the enclosure is below a threshold. If the result of the determination is YES, which indicates that the current temperature of the internal volume of the enclosure is below the threshold, the method proceeds to Step 502. If the result of the determination is NO, which indicates the current temperature of the internal volume of the enclosure is not below the threshold, the method ends.

In Step 502, an air circulation component and a heater located in the bezel are turned on (or otherwise activated). In one or more embodiments of the invention, the air circulation component and the heater are turned on by the heater control component. The air circulation component will start to create low pressure and high pressure regions in the internal volume of the enclosure. Due to an induced pressure difference in the internal volume of the enclosure, a number of airflow flappers will be closed such that air intake from and exhaust to an external volume of the enclosure will be prevented, or at least significantly reduced.

Further, turning on the air circulation component may result in distributing thermal energy (i.e., hot air in the internal volume of the enclosure) to a colder region(s) in the enclosure via the environmental control component. This may provide an increase in the temperature of the hardware components that are located in the colder region(s) of the enclosure. Because the air intake from the external volume of the enclosure is prevented, or at least significantly reduced, hot air remains within the internal volume of the enclosure.

In Step 504, a second determination is made about whether the current temperature of the internal volume of the enclosure is above and/or equal to the threshold. If the result of the second determination is YES, which indicates the current temperature of the internal volume of the enclosure is above and/or equal to the threshold, the method proceeds to Step 508. If the result of the second determination is NO, which indicates the current temperature of the internal volume of the enclosure is not above and/or equal to the threshold, the method proceeds to Step 506.

Continuing with the discussion of FIG. 5, in Step 506, the method waits until the air circulation fan and the heater bring the internal volume of the enclosure to a temperature that is above and/or equal to the threshold.

In Step 508, when the current temperature of the internal volume of the enclosure is above and/or equal to the threshold, the air circulation component and the heater located in the bezel are turned off. In one or more embodiments of the invention, the air circulation component and the heater are turned off by the heater control component. Turning off the air circulation component may significantly affect the induced pressure difference in the internal volume of the enclosure such that the number of airflow flappers and the environmental control component might return to their equilibrium operation conditions (e.g., the airflow flappers return to an open position such that the volume of air in the internal volume of the enclosure may be expelled from the enclosure).

The method ends following Step 508.

In one or more embodiments of the invention, with the help of Steps 502-508, circulation of hot air in the internal volume of the enclosure is performed. The temperature of the internal volume of the enclosure is brought to a temperature where the hardware components of the computing device may continue to operate in the harsh environmental conditions. Further, the stability and functionality of the computing device may be improved.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A computing device, comprising:
    a bezel, wherein the bezel comprises an air circulation component and a heater apparatus;
    an environmental control component; and
    an enclosure, wherein the enclosure comprises a plurality of hardware components, wherein the bezel is affixed to a frontside of the enclosure and configured to heat an internal volume of the enclosure,
    wherein, in order to form a uniform air circulation within the internal volume of the enclosure, a first airflow direction generated by the air circulation component is orthogonal to a second airflow direction generated by the environmental control component.

2. The computing device of claim 1, further comprising:
    a heater control component configured to initiate operation of the air circulation component and the heater apparatus when a temperature of the internal volume of the enclosure is below a threshold.

3. The computing device of claim 1, wherein the heater apparatus comprises a heater.

4. The computing device of claim 3, wherein the heater apparatus further comprises a heat sink.

5. The computing device of claim 4, wherein the heat sink, when heated by the heater, transfers thermal energy to a volume of air circulating within the internal volume of the enclosure.

6. The computing device of claim 1, wherein the air circulation component, when initiated by the heater control component, circulates air in the internal volume of the enclosure.

7. The computing device of claim 1, wherein a first portion of a connector is affixed to the bezel and a second portion of the connector is located in the enclosure, wherein the bezel receives power via the connector.

8. The computing device of claim 7, wherein the connector is a blind-mate power connector or a magnetic power connector.

9. The computing device of claim 1, further comprising:
    a temperature sensor operatively connected to the heater control component and configured to detect a temperature within the internal volume of the enclosure,
    wherein the heater control component is configured to control the bezel based on the temperature within the internal volume of the enclosure.

10. A method for managing a temperature of an internal volume of an enclosure, comprising:
    making a determination, based on a current temperature of the internal volume of the enclosure, that the current temperature of the internal volume of the enclosure is below a threshold,
    wherein a computing device comprises a bezel, an environmental control component, and the enclosure, wherein the bezel comprises at least an air circulation component,
    wherein, in order to form a uniform air circulation within the internal volume of the enclosure, a first airflow direction generated by the air circulation component is orthogonal to a second airflow direction generated by the environmental control component;
    in response to the determination:
        turning on the air circulation component and a heater located in the bezel of the enclosure.

11. The method of claim 10, further comprising:
    making a second determination, based on the current temperature of the internal volume of the enclosure, that the current temperature of the internal volume of the enclosure is above or equal to the threshold;
    in response to the second determination:
        turning off the air circulation component and the heater located in the bezel of the enclosure.

12. An information handling system, comprising:
    a cabinet housing a plurality of computing devices;

the plurality of computing devices, wherein each of the computing devices comprises:
a bezel, wherein the bezel comprises an air circulation component and a heater apparatus;
an environmental control component;
an enclosure, wherein the enclosure comprises a plurality of hardware components, wherein the bezel is affixed to a frontside of the enclosure and configured to heat an internal volume of the enclosure,
wherein, in order to form a uniform air circulation within the internal volume of the enclosure, a first airflow direction generated by the air circulation component is orthogonal to a second airflow direction generated by the environmental control component.

13. The information handling system of claim 12, wherein each of the computing devices further comprises:
a heater control component configured to initiate operation of the air circulation component and the heater apparatus when a temperature of the internal volume of the enclosure is below a threshold.

14. The information handling system of claim 12, wherein the heater apparatus comprises a heater.

15. The information handling system of claim 14, wherein the heater apparatus further comprises a heat sink.

16. The information handling system of claim 15, wherein the heat sink, when heated by the heater, transfers thermal energy to a volume of air circulating within the internal volume of the enclosure.

17. The information handling system of claim 12, wherein the air circulation component, when initiated by the heater control component, circulates air in the internal volume of the enclosure.

18. The information handling system of claim 12, wherein a first portion of a connector is affixed to the bezel and a second portion of the connector is located in the enclosure, wherein the bezel receives power via the connector.

19. The information handling system of claim 18, wherein the connector is a blind-mate power connector or a magnetic power connector.

20. The information handling system of claim 12, wherein each of the computing devices further comprises:
a temperature sensor operatively connected to the heater control component and configured to detect a temperature within the internal volume of the enclosure,
wherein the heater control component is configured to control the bezel based on the temperature within the internal volume of the enclosure.

* * * * *